(12) United States Patent
Shaul et al.

(10) Patent No.: US 10,036,394 B2
(45) Date of Patent: *Jul. 31, 2018

(54) BLOWER TRAY

(71) Applicant: Google LLC, Mountain View, CA (US)

(72) Inventors: Kenneth Dale Shaul, Sunnyvale, CA (US); Soheil Farshchian, San Jose, CA (US); Roy Micheal Bannon, Palo Alto, CA (US); Angela Chen, Mountain View, CA (US); Jonathan D. Beck, Mountain View, CA (US)

(73) Assignee: Google LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/669,551

(22) Filed: Aug. 4, 2017

(65) Prior Publication Data

US 2017/0335855 A1 Nov. 23, 2017

Related U.S. Application Data

(63) Continuation of application No. 14/852,989, filed on Sep. 14, 2015, now Pat. No. 9,763,361.

(51) Int. Cl.
*H05K 7/20* (2006.01)
*F04D 25/16* (2006.01)
(Continued)

(52) U.S. Cl.
CPC ......... *F04D 25/166* (2013.01); *F04D 29/582* (2013.01); *H05K 7/20572* (2013.01);
(Continued)

(58) Field of Classification Search
CPC ............. H05K 7/20581; H05K 5/0213; H05K 7/20736
See application file for complete search history.

(56) References Cited

U.S. PATENT DOCUMENTS 5,210,680 A 5/1993 Scheibler
5,825,620 A 10/1998 Chrysler et al.
(Continued)

FOREIGN PATENT DOCUMENTS

JP 1703783 9/2006
TW 200801344 1/2008
(Continued)

OTHER PUBLICATIONS

Owano, "Panasonic will release spherical air blower," TechXplore, Apr. 7, 2015 [retrieved on Sep. 3, 2015]. Retrieved from the Internet: URL<http://techxplore.com/news/2015-04-panasonic-spherical-air-blower.html>, 2 pages.
(Continued)

*Primary Examiner* — Hung V Ngo
(74) *Attorney, Agent, or Firm* — Fish & Richardson P.C.

(57) ABSTRACT

Methods, systems, and apparatus, including a housing defining a top surface, a bottom surface, and first and second side surfaces. Also included is a first rail extending from the first side surface and a second rail extending from the second surface such that when the first and second rails are slidably engaged with a third surface. A blower device is included that is axially disposed between the top and bottom surface, wherein a first end of the housing defines a first plenum outlet, the top surface defines a plenum inlet, the bottom surface defines a second plenum outlet that is positioned on a second side of the blower device and that fluidly couples the first plenum chamber to the second plenum chamber. Further, the second plenum chamber is formed by the first and second rails, the bottom surface and the third surface has a third plenum outlet.

10 Claims, 5 Drawing Sheets

(51) Int. Cl.
*F04D 29/58* (2006.01)
*H05K 7/00* (2006.01)
*F04D 25/00* (2006.01)

(52) U.S. Cl.
CPC ..... *H05K 7/20581* (2013.01); *H05K 7/20736* (2013.01); *F04D 25/00* (2013.01); *H05K 7/00* (2013.01)

(56) References Cited

U.S. PATENT DOCUMENTS

| | | |
|---|---|---|
| 6,042,474 A | 3/2000 | Harvey et al. |
| 6,407,918 B1 | 6/2002 | Edmunds |
| 6,594,148 B1 | 7/2003 | Nguyen |
| 6,625,033 B1 | 9/2003 | Steinman |
| 6,668,565 B1 | 12/2003 | Johnson |
| 7,430,117 B2 | 9/2008 | Shabany |
| 7,508,664 B2 | 3/2009 | Holland |
| 7,542,290 B2 | 6/2009 | Tracy et al. |
| 2004/0207983 A1 | 10/2004 | Cheng-Yi et al. |
| 2005/0019155 A1 | 1/2005 | Lasko |
| 2006/0120040 A1 | 6/2006 | Chen |
| 2006/0256522 A1 | 11/2006 | Wei |
| 2007/0253830 A1 | 11/2007 | Hartel et al. |
| 2008/0101020 A1 | 5/2008 | Curtis et al. |
| 2010/0258377 A1* | 10/2010 | Cash ............... G06F 1/182 181/258 |
| 2014/0071621 A1 | 3/2014 | Dong |
| 2015/0382510 A1 | 12/2015 | Serjak |

FOREIGN PATENT DOCUMENTS

| | | |
|---|---|---|
| TW | 201111645 | 4/2011 |
| TW | M497205 | 3/2015 |
| WO | 98/56226 | 12/1998 |

OTHER PUBLICATIONS

Wallossek, "Airflow: Horizontally-Mounted Tower Cooler," tomshardware.com, Nov. 7, 2011 [retrieved on May 12, 2015]. Retrieved from the Internet: URL<http://www.tomshardware.com/reviews/cooling-airflow-heatsink.3053-6.html>, 8 pages.

International Search Report and Written Opinion in International Application No. PCT/US2016/050548, dated Nov. 25, 2016, 14 pages.

Office Action issued in Taiwanese Application No. 105129708, dated Apr. 21, 2017, 3 pages (English translation).

* cited by examiner

BLOWER TRAY

CROSS-REFERENCE TO RELATED APPLICATIONS

This application is a continuation application of, and claims priority to, U.S. patent application Ser. No. 14/852,989, titled "BLOWER TRAY," filed on Sep. 14, 2015. The disclosure of the foregoing application is incorporated herein by reference in its entirety for all purposes.

BACKGROUND

Cooling of computing devices, such as computer towers and chassis, is required for the proper functioning of the computing device. As computing devices are operating, heat is produced by the operating components within the computing devices. Computing devices may have fans within them to cause air to flow around the components of the computing device to provide cooling. The fan may be operatively coupled to plenums to draw air through the computing device to facilitate cooling.

Often computing devices are arranged to maximize the use of available space, such as in a server farm. This has led to the development of high density racks with multiple processing trays. The resulting space within the racks for the blower fans has thus been reduced, which, in turn, leads to a reduced efficiency in the operation of blower fans.

SUMMARY

This specification describes technologies relating to blower tray apparatus. In general, one innovative aspect of the subject matter described in this specification includes a housing defining a top surface, a bottom surface, and first and second side surfaces connected the top surface and the bottom surface and defining a first plenum chamber between the top, bottom and first and second surfaces. Also included is a first rail extending from the first side surface and a second rail extending from the second surface such that when the first and second rails are slidably engaged with a third surface that is in parallel disposition to the bottom surface, the first and second rails, the bottom surface and the third surface define a second plenum chamber. A blower device is included that is axially disposed between the top and bottom surface such that an axis of rotation of a blower fan of the blower device is substantially perpendicular to the top surface and the bottom surface, wherein a first end of the housing defines a first plenum outlet for the first plenum chamber on a first side of the blower device, the top surface defines a plenum inlet that is aligned with the blower fan so that the plenum inlet is over at least a portion of the blower fan, the bottom surface defines a second plenum outlet that is positioned on a second side of the blower device that is opposite the first side of the blower device and that fluidly couples the first plenum chamber to the second plenum chamber formed by first and second rails, the bottom surface and the third surface. Further, the second plenum chamber is formed by the first and second rails, the bottom surface and the third surface has a third plenum outlet. Particular embodiments of the subject matter described in this specification can be implemented so as to realize one or more of the following advantages. The blower tray apparatus enables high airflow rate and high pressure resistance levels while facilitating a blind mate connection for power and control connections. This results in a hot-swappable blower tray assembly. The blower tray apparatus thus enables cooling of a high density electronics chassis and equipment that have a high availability requirement.

The performance of blowers degrades as the housing clearance to the blower fan blade drops below 0.5× diameter of the blower fan. However, the blower tray apparatus described in this document has a unique plenum arrangement that overcomes the performance degradation when there is otherwise insufficient space to provide housing clearance. Thus, the use of a blower tray apparatus, as described in this document, allows for a reduction in the required width of air chamber(s) and air outlet(s) in fluid communication with the blower fan. The blower tray apparatus, as described herein, can be used with a narrow chassis and produce the same (or nearly the same) airflow capabilities as a larger chassis that would otherwise be required.

The compact blower tray apparatus described in this document, in combination with the blind mate connectors, allows for easy and quick removal and replacement, thus realizing a high mechanical efficiency in spite of the compact form factor. Furthermore, the blower tray apparatus is low cost and simple to manufacture. Additionally, the resulting plenums and fluid couplings reduces back pressure on the blower module that would otherwise be present in the absence of such advantageously arranged couplings. The reduction in back pressure results in a reduction in the power consumed by the blower tray apparatus.

Finally, a planar gasket disposed on the blower tray apparatus inlet is highly reliable and provides for a highly efficient gasket seal.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

This document describes apparatus, systems, and methods for a blower tray apparatus that may be used with a chassis and draw air, for example, and into the chassis, and through the blower tray apparatus. These features and additional features are described in more detail below.

Figure 1A:
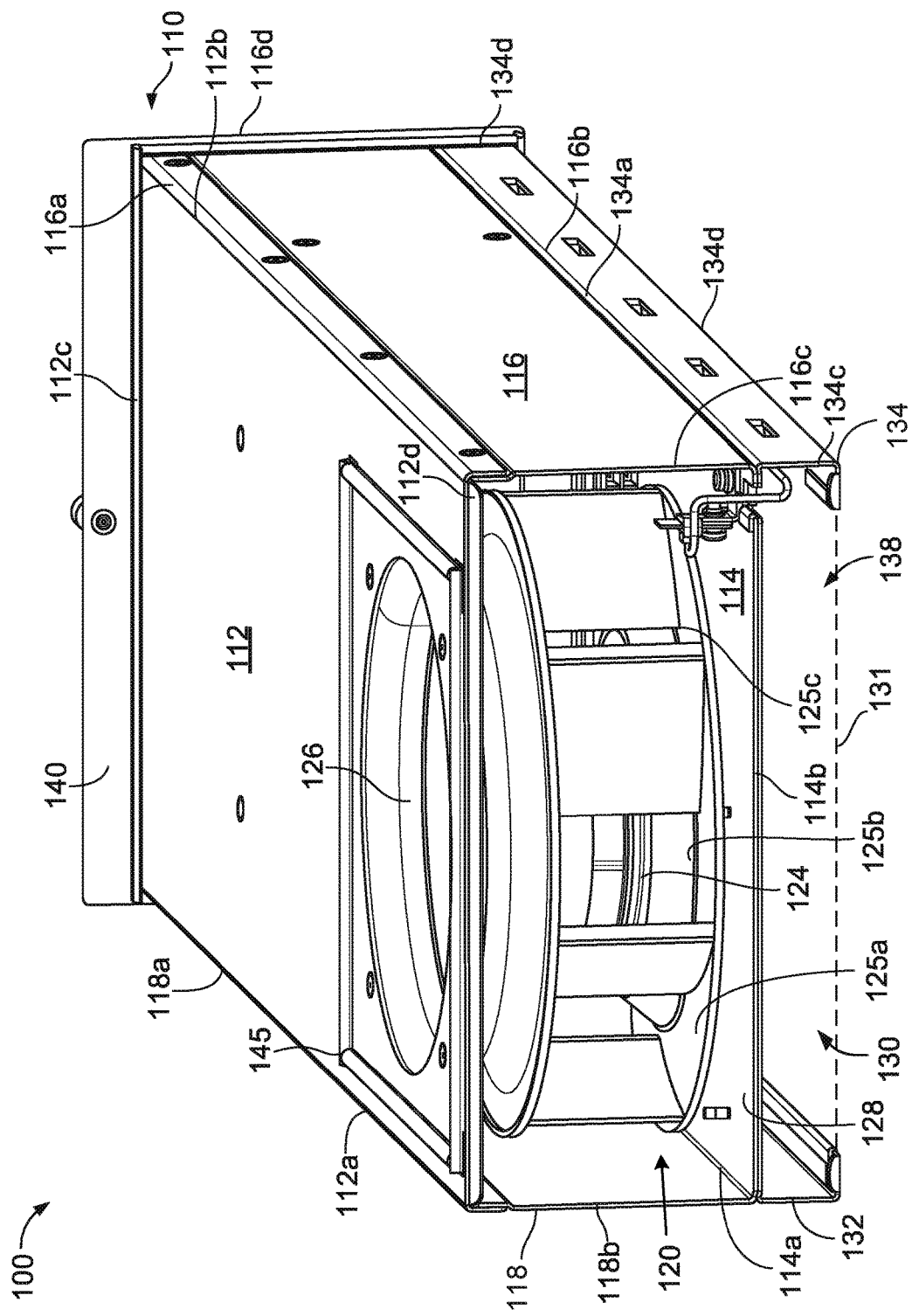
FIG. 1A is a perspective view of a blower tray apparatus from a back end of the blower tray apparatus.

FIG. 1A is a perspective view of a blower tray apparatus 100 from a back end of the blower tray apparatus. The blower tray apparatus 100 includes a housing 110 that includes a top surface 112, a bottom surface 114, a first side surface 116, and a second side surface 118. The top surface 112, in the current implementation, includes edges 112a, 112b, 112c, and 112d. The bottom surface 114, in the current implementation, includes edges 114a and 114b and corresponding opposite edges (not shown). First side 116 includes edges 116a, 116b, 116c, and 116d. Second side 118 includes edges 118a and 118b and corresponding opposite sides. The top surface 112 is substantially parallel to the bottom surface 114, and the first side surface 116 is parallel to the second side surface 118 as shown. The housing 110 may be made of metal, plastic, a combination thereof, or any other material and structure that may direct airflow.

The housing 110 defines a plenum chamber 120 between the top surface 112, bottom surface 114, and first and second side surfaces 116, 118. The plenum chamber 120 includes a blower device 122 (shown in FIG. 1B) that may draw air from outside of the plenum chamber 120 into the plenum chamber 120. The blower device 122 includes a blower fan 124 that draws the air to the blower device 122, and the blower device 122 may include one or more openings 125a, 125b, and 125c, from the blower fan 124 to the plenum chamber 120. The blower fan 124 is axially disposed between the top surface 112 and the bottom surface 114 such that an axis of rotation of a blower fan 124 is substantially perpendicular to the top surface 112 and the bottom surface 114.

The top surface 112 includes a plenum inlet 126 that enables the blower fan 124 to draw air from outside of the plenum chamber 120. The plenum inlet 126 may be of different shapes and sizes, and the plenum inlet 126 is aligned with the blower fan 124 so that the inlet is located over at least a portion of the blower fan 124 for the blower fan 124 to draw air into the plenum chamber 120 from outside of the plenum chamber 120.

Additionally, the housing 110 includes a plenum outlet 128 that is an opening that may extend substantially parallel to the radial axis of the blower device 122 and be defined by the edges 112d, 114b, 116c and 118b. The plenum outlet 128 and a front side 140 are positioned on longitudinally opposite sides of the blower device 122 relative to one another so that the plenum outlets 128 is located at the "back end" of the blower tray apparatus 100.

As will be describe with reference to the chassis 210 (shown in FIG. 2A), the blower tray apparatus 100 will form another plenum 130 when slidably engaged with a third surface of the chassis 210. The third surface, also referred to as an assembly surface 131 is represented by the phantom line 131 and is in parallel disposition to the bottom surface 114 of the blower tray apparatus 100. The plenum chamber 130 is thus defined by a first rail 132 that extends from edge 116b of the first side 116 and a second rail 134 that extends from edge 118b of the second side 118, the top surface 114, and the third surface 131 when slidably engaged with the chassis 210. The first rail 132 includes edges and the second rail 134 includes edges 134a, 134b, 134c, and 134d. The first rail 132 and second rail 134 may be substantially parallel with the first side 116 and second side 118.

The first rail 132 and the second rail 134 are configured to engage with guides on the chassis 210. For example, the first rail 132 and the second rail 134 may slidably engage respective engagement surfaces in the chassis 210, such as engagement surface 231 and as described further below. Once the blower tray assembly 100 is inserted into the chassis, the plenum chamber 130 is defined by the assembly surface 131, the first rail 132, the second rail 134 and the bottom surface 114. In the current implementation, plenum chamber 130 may be of a smaller volume than of the volume of the plenum chamber 120; however, such a configuration is not required, and in other implementations, different relative volumes of the plenum chamber 120 and the plenum chamber 130 may be used.

The plenum chamber 130 as formed includes a plenum outlet 138 that may extend substantially parallel to the radial axis of the blower device 122. In the implementation depicted, the outlet 138 is defined by the edges of the rails 132 and 134, the bottom surface edge 114b, and the edge of the assembly surface 131.

The front side 140 of the housing 110 may form an end of the plenum chamber 130 such that the plenum chamber 130 may extend the length of the blower tray assembly 100. As will be described in more detail below, a portion of the plenum chamber 130 may be occupied by an assembly 161 for an electrical connector 160 on the assembly 100 that mates with a mating component 208 on the chassis 210.

Further, the plenum inlet 126 may include a gasket 145 to secure the plenum inlet 126 and provide a seal to prevent air and airflow from entering any other place than the plenum inlet 126 or escaping from the blower device 122 or the plenum chamber 120. The gasket 145 may peripherally surround the plenum inlet 126.

Figure 1B:
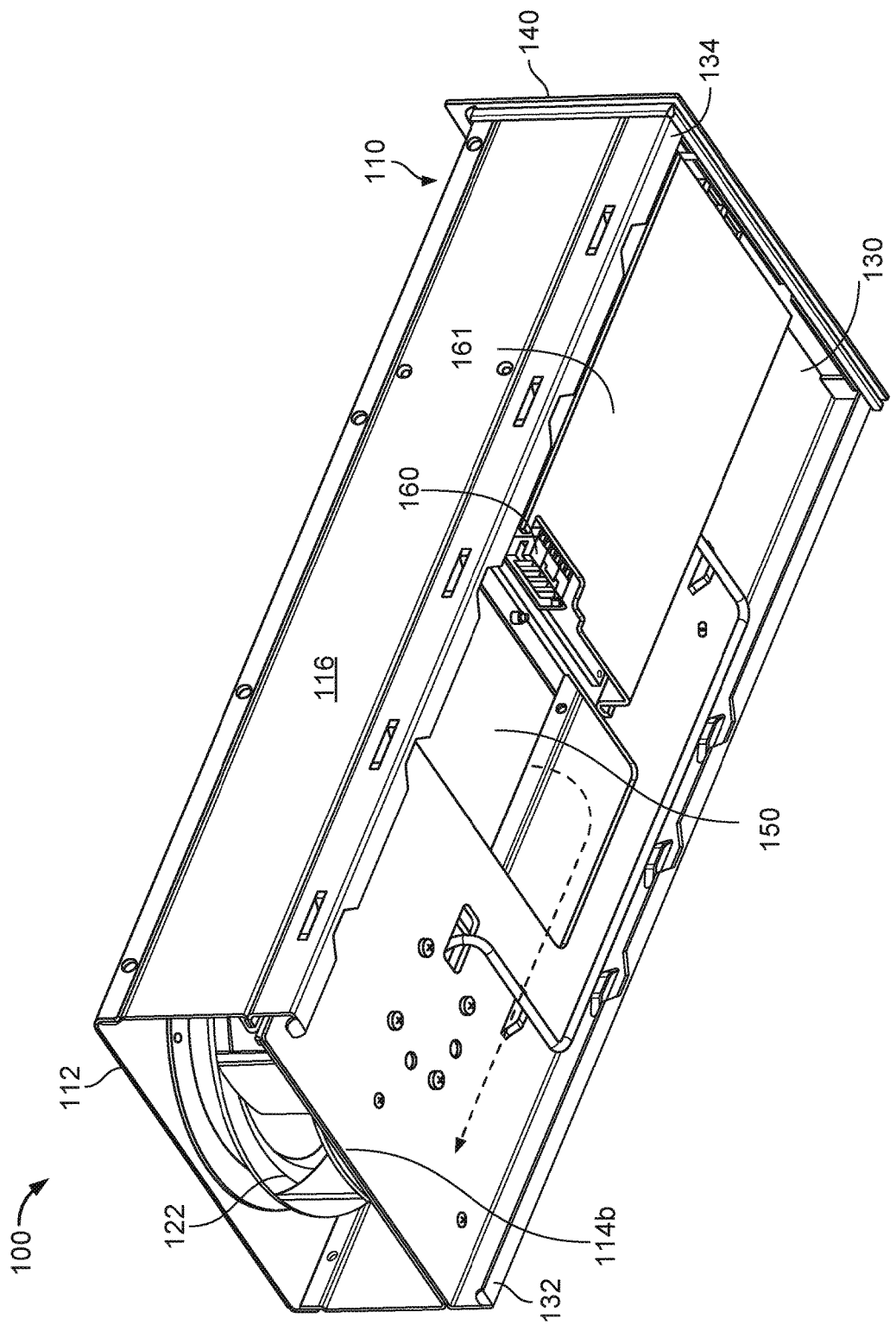
FIG. 1B is a perspective view from underneath the blower tray apparatus.

FIG. 1B is a perspective view from underneath the blower tray apparatus 100. As seen in blower tray apparatus 100, plenum outlet 150 is included between, and fluidly connects, plenum chamber 120 to plenum chamber 130 when the plenum chamber 130 is formed. Plenum outlet 150 is an opening located in the bottom surface 114. In some implementations, plenum outlet 150 is radially positioned on one side of the blower device 122 that is opposite the side of the blower device 122 that is closest to the plenum outlet 128. Plenum outlet 150 may be centrally positioned on the bottom surface 114; however, such a positioning is not required, so long as the blower device 122 is interposed between the outlet 150 and the outlet 128.

An electrical connector 160 may be fastened to the bottom surface 114 by a housing 161 and extend within a portion of plenum chamber 130. The electrical connector 160 may be positioned on a side of the plenum outlet 150 that is opposite a side at which the blower device is positioned longitudinally relative to the plenum outlet 150. In some implementations, electrical connector 160 and housing 161 may extend within the plenum chamber 130 from the bottom surface 114 to a distance that is less than or equal to the height of each of the first rail 132 and the second rail 134 so that it may slide unimpeded into the chassis 210. The electrical connector 160 is configured to meet a mating component 280, shown in FIG. 2B, upon fully inserting the blower tray apparatus 100 into the chassis 210. As such, a blind mate connection occurs between the electrical connector 160 and the mating component 280.

Figure 2A:
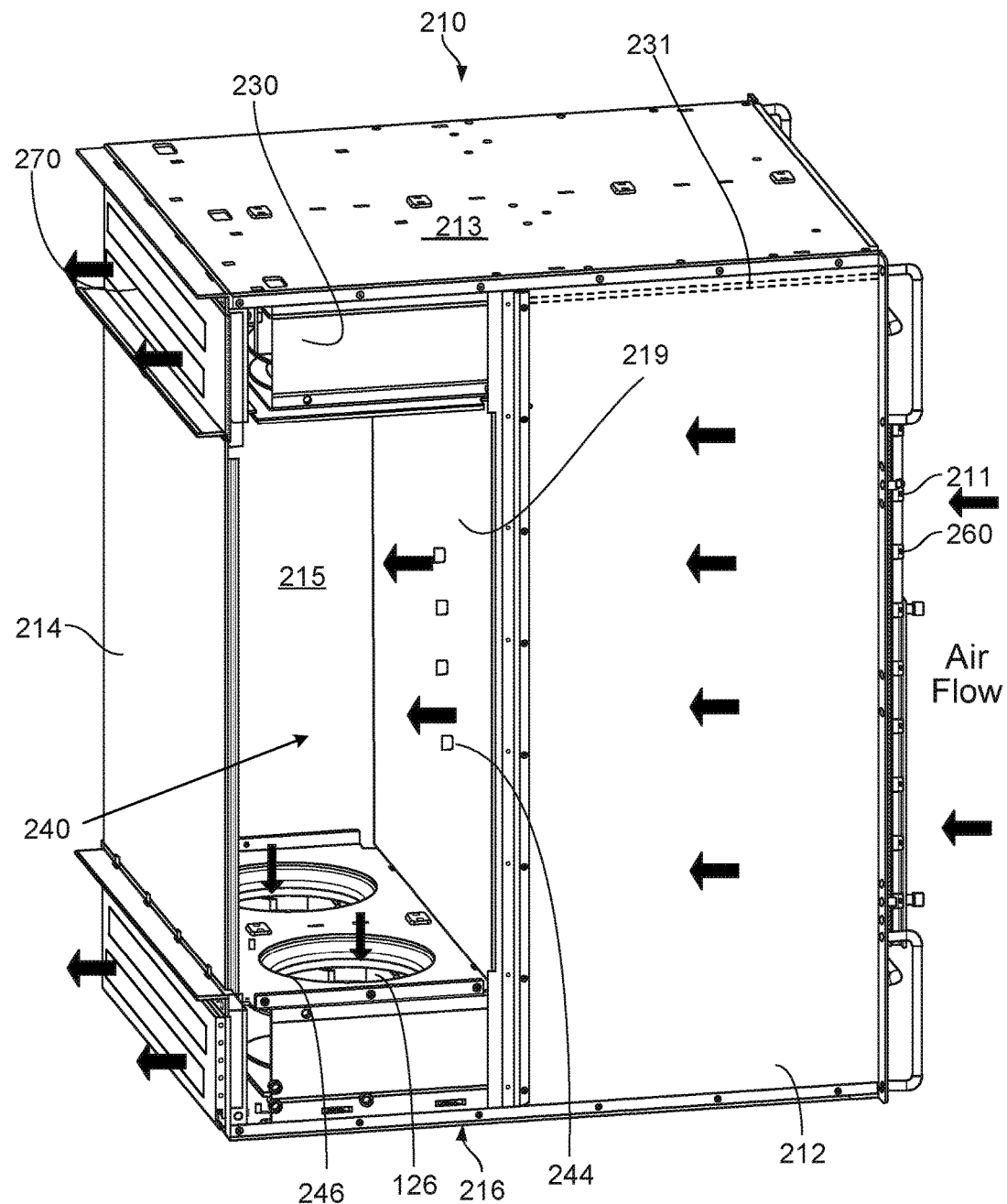
FIG. 2A is a perspective side view of multiple blower tray apparatus in a chassis with a cut away section.

FIG. 2A is a perspective side view of multiple blower tray apparatus in a chassis with a cut away section. As seen in FIG. 2A, a chassis 210 may be included with one or more blower tray apparatus assembled within the chassis. A chassis 210 may be a computer case that includes and encloses, for example, multiple components of a computer (e.g., a central processing unit, memory, electrical circuits, etc.), or even multiple racks of computers or other computer devices.

The chassis 210, in the current implementation, includes end 211, side 212, top surface 213, end 214, side 215, and bottom surface 216 (not shown). Side 212 is partially cut away to show the interior of the chassis 210. Side 215 may be the same as side 212 on the opposite side of the chassis 210 as side 212, and side 214 may be substantially parallel to side 212 and substantially perpendicular to ends 211 and 214. Each blower tray apparatus 100 is inserted in the chassis 210 in a blower tray slot 230 defined within the surfaces 211, 212, 214, and 215 of the chassis 210.

A blower tray slot 230 may be defined by an interior surface 217, the top surface 213, and sides 212 and 214. As shown in FIG. 2A, the interior surface 217 is the assembly surface 131 as described in FIG. 1. Engagement surfaces, one of which is shown in phantom as 231, receive and interact with slot rails 132 and 134 for slidable engagement.

Additionally, a chassis chamber 240 is defined between end 214, sides 212 and 215, interior surfaces 217, interior surface 219, top surface 213, and bottom surface 216. Interior surface 219 may include exhaust ports 244 that define openings to allow air to travel from intake ports 260 in the front of the chassis 210 and into the chassis chamber 240, which, in turn, provides for cooling of the components between the front of the chassis 210 and the surface 219. The chassis chamber 240 includes chassis chamber exhaust ports 246 that enable air to travel from the chassis chamber 240 into the housing 110 of the blower tray apparatus 100. The chassis chamber exhaust ports 246 are openings that align with the plenum inlet 126 in order for air to travel into blower device 122 for exhausting out the plenum outlets 128 and 138 through exhaust ports 270.

Thus, once a blower tray apparatus 100 is inserted into the chassis 210 and begins operating, air is drawn through the front of the chassis 210 to the chamber 240, then through the port 246 and exhausted out the plenum outlets 128 and 138.

In particular, upon the air entering the chassis chamber 240, the one or more blower tray apparatus 100 may draw the air through its blower device 122 via the blower fan 124. A portion of the air that enters plenum chamber 120 will exit the plenum chamber 120 through plenum outlet 128 and exit the chassis 210 through exhaust port 270. Additionally, the remaining portion of the air in plenum chamber 120 will exit via plenum outlet 150 and enter plenum chamber 130 and exit via plenum outlet 138.

Figure 2B:
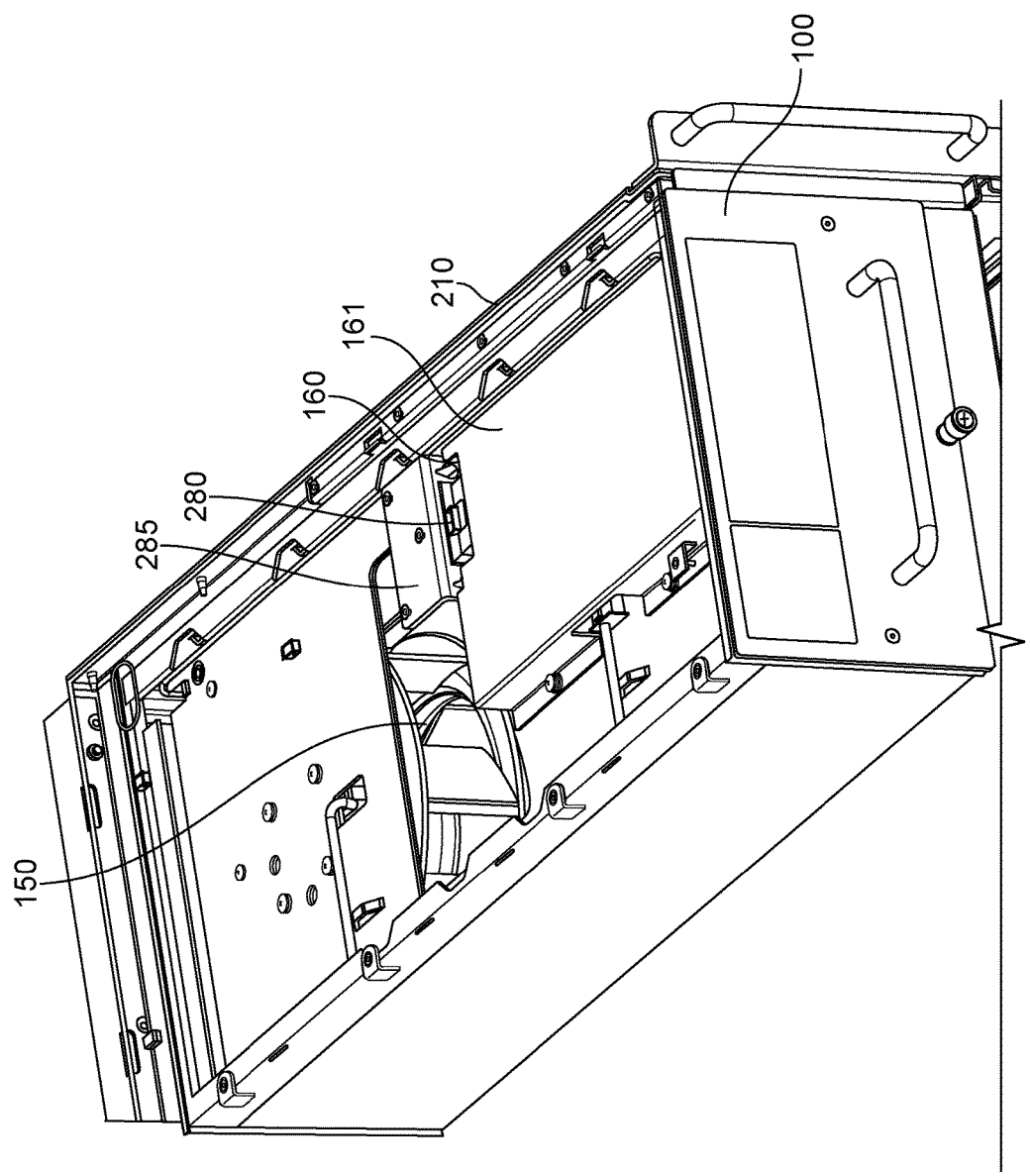
FIG. 2B is a perspective view with a cut away section from one end of the chassis with a blower tray apparatus connected in the chassis.

FIG. 2B is a perspective view with a cut away section from one end of the chassis 210 with a blower tray apparatus 100 connected in the chassis. As seen in FIG. 2B, a mating component 280 is included in the blower tray slot 230. As the blower tray apparatus 100 is positioned within the blower tray slot 230 (e.g., via sliding the first rail 132 and second rail 134 within rail slots 231 of the chassis 210), the electrical connector 160 of the blower tray apparatus 100 aligns with the mating component 280 of the chassis 210. The mating component 280 may be connected to a bracket 285, as shown in FIG. 2B, to provide the alignment. Upon connection between the electrical connector 160 and the mating component 280, the blower tray apparatus 100 has electrical power (e.g., provided by the chassis 210) and is controlled by the chassis 210 (e.g., to speed up or slow down the blower fan 124).

Figure 3:
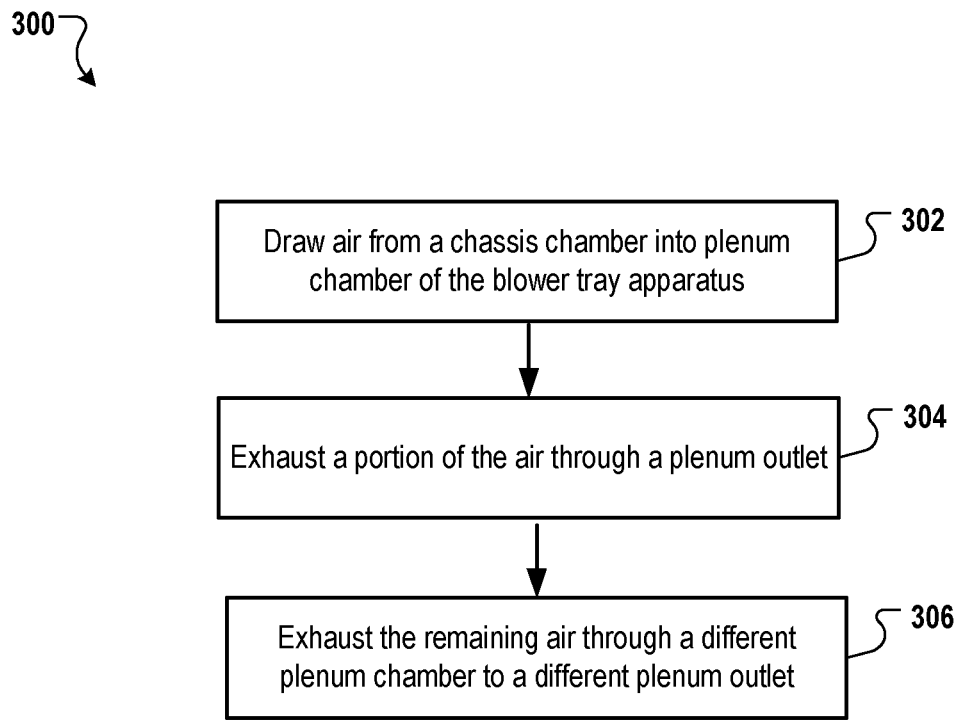
FIG. 3 is a flow diagram of drawing air to and passing the air through a blower tray apparatus.

FIG. 3 is a method flow diagram of drawing air to and passing the air through a blower tray apparatus 100. Air may be drawn, by a blower fan 124 of the blower device 122, from a chassis chamber (e.g., chassis chamber 240) in a chassis (e.g., chassis 210) into a plenum chamber 120 of the blower tray apparatus 100 (302). A portion of the air drawn into the plenum chamber 120 is exhausted through plenum outlet 128 (304). The remaining portion of the air in plenum chamber 120 is exhausted through plenum outlet 150 to plenum chamber 130, which is external to the blower tray apparatus 100 and the chassis chamber 240. The air in the plenum chamber 130 is exhausted through plenum outlet 138 (306). If the blower tray apparatus 100 is assembled in the chassis 210, then the air that is exhausted through plenum outlet 128 and plenum outlet 138 may be exhausted from the chassis 210 via one or more exhaust port 270.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. An apparatus, comprising:
   a housing defining a top surface, a bottom surface, and first and second side surfaces connected the top surface and the bottom surface and defining a first plenum chamber between the top, bottom and first and second surfaces;
   a first rail extending from the first side surface and a second rail extending from the second surface such that when the first and second rails are slidably engaged with a third surface that is in parallel disposition to the bottom surface, the first and second rails, the bottom surface and the third surface define a second plenum chamber;
   wherein:
   a first end of the housing defines a first plenum outlet for the first plenum chamber on a first side of a blower device that includes a blower fan;
   the top surface defines a plenum inlet that is aligned with the blower fan so that the plenum inlet is over at least a portion of the blower fan;
   the bottom surface defines a second plenum outlet that is positioned on a second side of the blower device that is opposite the first side of the blower device and that fluidly couples the first plenum chamber to the second plenum chamber formed by first and second rails, the bottom surface and the third surface; and the second plenum chamber formed by the first and second rails, the bottom surface and the third surface has a third plenum outlet.

2. The apparatus of claim 1, wherein:
the first plenum outlet at the first end of the first housing defines an outlet plane substantially parallel to a radial axis of the blower device; and
the third plenum outlet defines an outlet plane substantially parallel to the radial axis of the blower device on the first side of the blower device.

3. The apparatus of claim 1, further comprising an electrical connector positioned on the bottom surface such that the electrical connector is within the second plenum chamber formed by the first and second rails, the bottom surface and the third surface.

4. The apparatus of claim 3, wherein the electrical connector has a height that is less than a height of the first and second rails.

5. The apparatus of claim 4, wherein the electrical connector is positioned on a side of the second plenum outlet that is opposite a side at which the blower device is positioned longitudinally relative to the second plenum outlet.

6. The apparatus of claim 1, wherein first plenum inlet includes a peripheral gasket surrounding the first plenum inlet.

7. The apparatus of claim 1, wherein the first plenum chamber is further defined by a second end that extends at least to and connected to edges of the top surface, the bottom surface, and the first and the second side surfaces, the second end being positioned longitudinally on the second side of the blower device.

8. The apparatus of claim 1, further comprising:
a chassis defined by front, back, top, bottom and side surfaces;
a first interior surface that partially defines a first slot between the first interior surface and the top surface, wherein the first slot includes first and second rail slots to slidably receive the first housing by the first and second rails of the first housing;
a second interior surface connected to the first interior surface and defining a chassis chamber between the second interior surface and the back side surface of the chassis and a chassis chamber between the second interior surface and the front surface;
wherein:
the front surface of the chassis includes intake ports for air intake and the second interior surface includes exhaust ports that allow air to flow from the intake ports to the exhaust ports and into the chassis chamber;
the first interior surface includes a chassis chamber exhaust port that aligns with the plenum inlet of the top surface of the first housing; and
the top surface of the chassis forms the third surface that is in parallel disposition to the bottom surface of the first housing to define the second plenum chamber.

9. The apparatus of claim 8, further comprising:
an electrical connector positioned on the bottom surface such that the electrical connector is within the second plenum chamber formed by the first and second rails, the bottom surface and the third surface; and
a mating component positioned within the first interior surface such that the mating component is configured to connect with the electrical connector upon the first and second rails being at least partially slidably engaged with the first and second rail slots.

10. The apparatus of claim 8, wherein the back surface of the chassis includes one or more exhaust ports positioned in air communication with at least a portion of at least one of the first plenum outlet and the third plenum outlet, and wherein the one or more exhaust ports are configured to pass air out of the chassis.

* * * * *